United States Patent [19]

Eklund

[11] Patent Number: 5,313,082
[45] Date of Patent: May 17, 1994

[54] HIGH VOLTAGE MOS TRANSISTOR WITH A LOW ON-RESISTANCE

[75] Inventor: Klas H. Eklund, Sollentuna, Sweden

[73] Assignee: Power Integrations, Inc., Mountain View, Calif.

[21] Appl. No.: 18,080

[22] Filed: Feb. 16, 1993

[51] Int. Cl.$^5$ ............... H01L 27/085; H01L 29/784; H01L 29/808
[52] U.S. Cl. .................... 257/262; 257/250; 257/365; 257/335
[58] Field of Search ............ 257/137, 62, 262, 264, 257/365, 350, 192, 170, 172, 256, 260, 266, 328, 335, 336–339

[56] References Cited

U.S. PATENT DOCUMENTS

| | | | |
|---|---|---|---|
| 4,626,879 | 12/1986 | Colak | 257/336 |
| 4,811,075 | 3/1989 | Eklund | 257/369 |
| 5,124,773 | 6/1992 | Nakagawa et al. | 257/143 |

FOREIGN PATENT DOCUMENTS

| | | | |
|---|---|---|---|
| 0084667 | 3/1987 | Japan | 257/335 |

Primary Examiner—William Mintel
Assistant Examiner—Alexander Oscar Williams
Attorney, Agent, or Firm—Thomas E. Schatzel

[57] ABSTRACT

An embodiment of the present invention is an improved insulated-gate, field-effect transistor and a three-sided, junction-gate field-effect transistor connected in series on the same chip to form a high-voltage MOS transistor. An extended drain region is formed on top of a substrate of opposite conductivity material. A layer of material with a conductivity opposite to that of the material of the extended drain region is buried within the extended drain region such that field-effect pinch-off depletion zones extend both above and below the buried layer. A top layer of material similar to the substrate is formed by ion implantation through the same mask window as the extended drain region. The top layer covers the buried layer and extended drain region and itself is covered by a silicon dioxide layer above. Current flow through the extended drain is controlled by the substrate and buried layer when a voltage is applied to pinch-off the extended drain between them in a familiar field-effect fashion.

4 Claims, 1 Drawing Sheet

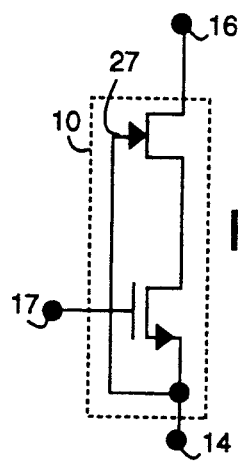
Fig._1A
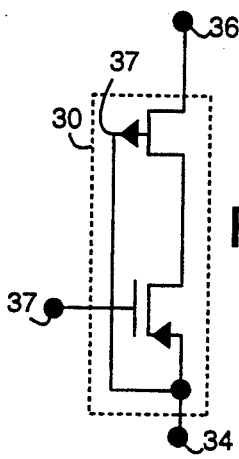
Fig._2A
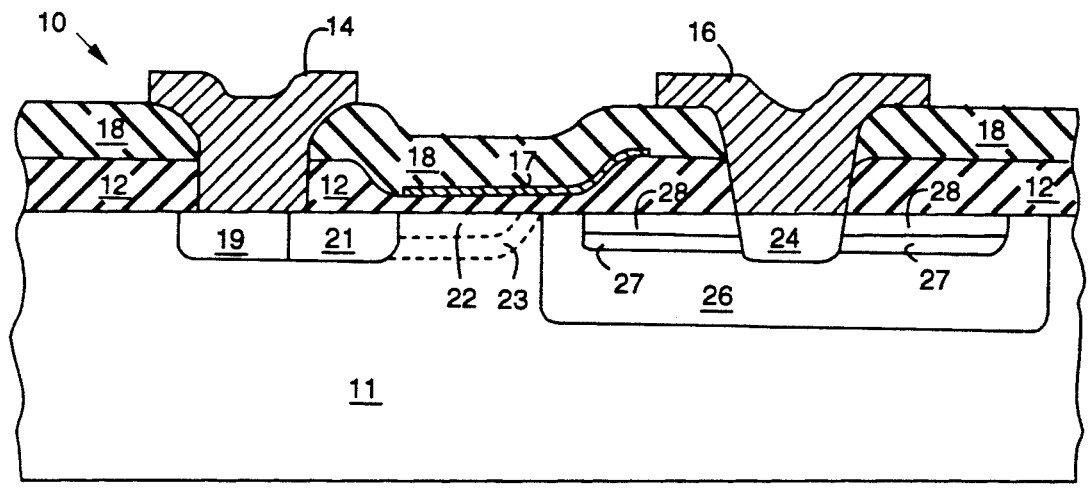
Fig._1B
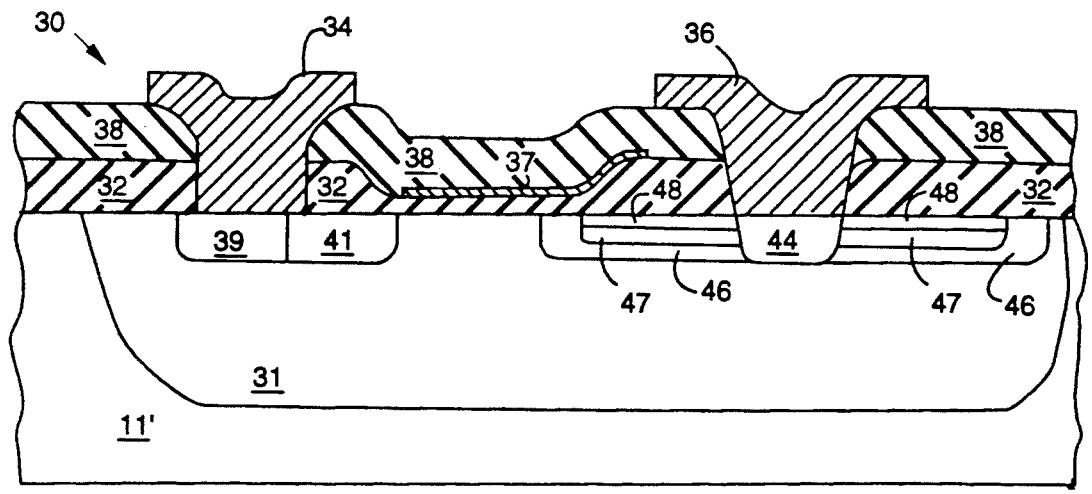
Fig._2B

HIGH VOLTAGE MOS TRANSISTOR WITH A LOW ON-RESISTANCE

BACKGROUND OF THE INVENTION

1. Field of the Invention

The present invention relates generally to high voltage metal-oxide semiconductor (MOS) transistors and more specifically to improvements that lower the inherent on-resistance of high voltage MOS transistors.

2. Description of the Prior Art

Insulated gate field effect transistors (IGFETs) or MOSFETs are conventionally placed in series with junction field effect transistors (JFETs) to make combination devices that can switch high voltages and that have low values of on-resistance. A lightly doped extended drain region is used so that the voltage is sustained by an offset gate. The voltage capability of such devices is determined by the doping of the substrate, the length of the extended drain region and the net number of charges therein. Improvement in on-resistance is substantially limited by the cross sectional area, length and degree of doping in the extended drain region.

U.S. Pat. No. 4,811,075, issued Mar. 7, 1989 to the present inventor, Klas H. Eklund, describes an insulated-gate, field-effect transistor and a double-sided, junction-gate field-effect transistor connected in series on the same chip to form a high-voltage MOS transistor. An extended drain region is formed on top of a substrate of opposite conductivity material. A top layer of material similar to the substrate is formed by ion implantation. The top layer covers a middle part of the extended drain. Current flow through the extended drain is controlled by the substrate and top layer which pinch-off the extended drain between them in a familiar field-effect fashion.

The extended drain region requires high levels of doping to achieve acceptable levels of conductivity. The resistance of the device when it is switched on will be very much dependent on the dimensions of the extended drain region and its doping concentration. Generally, those adjustments in these parameters that improve on-resistance will degrade voltage handling capability, and vice versa.

A lateral double-diffused MOS transistor device for source follower applications is described in U.S. Pat. No. 4,626,879, issued Dec. 2, 1986, to Sel Colak. An intermediate semiconductor layer of the same conductivity type as the channel region extends laterally from the channel region to beneath the drain contact region of a device. Colak states that this intermediate semiconductor layer substantially improves the punch through and avalanche breakdown characteristics of the device, thus permitting operation in the source-follower mode. A compact structure which features a relatively low normalized "'on' resistance" is also claimed. However, the on-resistance is not as low as it could be. FIG. 1 in Colak reveals that intermediate layer 16 isolates layer 18 from layer 14. Channel currents do not have the opportunity to flow both over and under the intermediate layer 16. In the present invention, the equivalent of the intermediate layer stops short, and thus permits dual current paths and concomitant lower on-resistance values.

An improved high voltage MOS transistor is needed in which very low levels of on-resistance can be realized without sacrificing high voltage performance.

SUMMARY OF THE PRESENT INVENTION

It is therefore an object of the present invention to provide a high voltage MOS transistor that has a relatively low on-resistance.

Briefly, an embodiment of the present invention is an improved insulated-gate, field-effect transistor and a three-sided, junction-gate field-effect transistor connected in series on the same chip to form a high-voltage MOS transistor. An extended drain region is formed on top of a substrate of opposite conductivity material. A layer of material with a conductivity opposite to that of the material of the extended drain (n—well) region is formed within the extended drain region. This layer of material is similar to the substrate is formed by ion implantation. A top layer is formed of a material of the same conductivity type as the extended drain. This top layer thus buries the extended drain region. The top layer covers both the buried layer and extended drain region and is itself covered by a silicon dioxide layer. Current flow through the extended drain is controlled by the substrate and buried layer when a voltage is applied to pinch-off the extended drain between them in a familiar fieldeffect fashion.

An advantage of the present invention is that a MOS transistor device is provided that has an improved on-resistance characteristic.

These and other objects and advantages of the present invention will no doubt become obvious to those of ordinary skill in the art after having read the following detailed description of the preferred embodiments which are illustrated in the various drawing figures.

IN THE DRAWINGS

FIG. 1A is a schematic diagram of a combination n-type MOS transistor and JFET transistor embodiment of the present invention;

FIG. 1B is a cross sectional view of a p—channel substrate with a high-voltage n—type MOS transistor that implement the transistor combination of FIG. 1A;

FIG. 2A is a schematic diagram of a combination p-type MOS transistor and JFET transistor embodiment of the present invention; and FIG. 2B is a cross sectional view of a substrata with an n—well and includes a high-voltage p—type MOS transistor that implement the transistor combination of FIG. 2A.

DETAILED DESCRIPTION OF THE EMBODIMENT

U.S. Pat. No. 4,811,075, which was issued Mar. 7, 1989 to the present inventor, is incorporated by reference herein and made a part of this application as if fully laid-out.

FIGS. 1A and 1B illustrate an n-channel type high-voltage MOS transistor, referred to by the general reference numeral 10, which is formed on a p-substrate 11 covered by a silicon dioxide layer 12. A metal source contact 14 and a metal drain contact 16 extend through the silicon dioxide layer 12 to the substrate 11. A polysilicon gate 17 is positioned between the source contact 14 and the drain contact 16 at a location where the silicon dioxide layer 12 is the thinnest, about five hundred angstroms. Gate 17 is slightly offset from substrate 11 and insulated by silicon dioxide layer 12. An IGFET or MOSFET type of transistor is thus contained in the area proximate to contacts 14 and 16 and gate 17 which serves as the gate electrode.

An insulation layer 18, typically comprised of silicon dioxide, covers gate 17 and layer 12. A p+ well 19 and an n+ well 21 are diffused into substrate 11 beneath source contact 14. Well 21 extends to contact an enhancement mode channel that is beneath and controlled by gate 17. A p—type threshold voltage implant 22 is used to adjust the transistor threshold voltage and a p—type punch-through implant 23 helps avoid punch-through voltage breakdown. An n+ well 24 is diffused into substrate 11. An n—type extended drain region 26 is typically diffused by ion implantation. Region 26 is approximately symmetrical and extends from beneath gate 17 to well 24 and a similar distance to the opposite side. A p—type JFET gate control layer 27 is buried beneath an n—top layer 28. Drain region 26 and n—top layer 28 act as a channel for a JFET transistor that uses buried layer 27 as a gate.

Compared to the prior art, and given similar dimensions, about half the on-resistance is provided between contacts 14 and 16 by virtue of the additional current path through n-top layer 28 that is electrically in parallel with extended drain region 26. This advantage can be used to reduce the dimensions to achieve a smaller device with an on-resistance characteristic that is at least as good as the prior art. The turn-off of transistor 10 includes placing a reverse bias between the PN junction of layers 26, 27 and 28 that will deplete layers 26 and 28. Since the depletion depth is proportional to the voltage of the reverse bias, cutoff is achieved more readily because of the strategic position of layer 27. Transistor 10 is capable of operating at several hundred volts to a thousand volts.

Gate 17 controls by field-effect the current passing laterally underneath it through substrate 11 to extended drain region 26 and top layer 28. Current flow in the extended drain region 26 is controlled by substrate 11 and buried layer 27. A field-effect from them may pinch-off current in the extended drain region 26 and n-top layer 28. Transistor 10 therefore effectively comprises an IGFET with a three-sided JFET. Although the IGFET is shown as a conventional type, it can be substituted with a lateral D-MOS or a depletion MOS type. Buried layer 27 allows a second path over itself and allows the net number of charges in the extended drain region 26 and n-top layer 28 to be at least $$\frac{3 \times 10^{12}}{cm^2},$$

which substantially improves the conductivity of the JFET channel between implant 23 and well 24, compared to the prior art. The pinch-off voltage of extended drain region 26 and n-top layer 28 is substantially more effective in transistor 10 compared to prior art devices because the depletion zone radiates out from within the JFET channel. This more effective construction can be used to lower the pinch-off voltages of devices that have comparable JFET channel cross sectional area, or it can be used to increase the JFET channel cross-sectional area to improve on-resistance without degrading pinch-off voltage from conventional performance levels.

FIGS. 2A and 2B illustrate a p-channel type high-voltage MOS transistor, referred to by the general reference numeral 30, which is a complement to that of transistor 10. P-channel type transistor 30 is formed in a n— well 31 within substrate 11' and is covered by a silicon dioxide layer 32, which serves as a gate dielectric layer. A metal source contact 34 and a metal drain contact 36 extend through the silicon dioxide layer 32 to the n— well 31. A polysilicon gate 37 is positioned between the source contact 34 and the drain contact 36 at a location where the silicon dioxide layer 32 is very thin. Gate 37 is slightly offset from n—well 31 and insulated by silicon dioxide layer 32. As was also the case similarly shown in FIG. 1, an IGFET or MOSFET type of transistor is thus contained in the area proximate to contacts 34 and 36 and gate 37 which serves as the gate electrode.

An insulation layer 38, typically comprised of silicon dioxide, covers gate 37 and layer 32. A n+ well 39 and an p+ well 41 are diffused into n— well 31 beneath source contact 34. Well 41 extends just over to an edge of gate 37. A p+ well 44 is diffused into n— well 31. A p—extended drain region 46 is typically diffused by ion implantation. Region 46 is approximately symmetrical and extends from beneath gate 37 to well 44 and a similar distance to the opposite side. An n-type JFET gate control layer 47 is buried beneath a p-top layer 48. A PN junction is thus formed between extended drain region 46 and buried layer 47 as well as between p-top layer 48 and buried layer 47. Extended drain region 46 and p-top layer 48 act as a split-path channel for a JFET transistor that has buried layer 47 for a gate control electrode.

Compared to the prior art, and given similar dimensions, about half the on-resistance is provided between contacts 34 and 36 by virtue of the additional current path through p—top layer 48 that is electrically in parallel with extended drain region 46. This advantage can be used to reduce the dimensions to achieve a smaller device with an on-resistance characteristic that is at least as good as the prior art. The turn-off of transistor 30 includes placing a reverse bias between the PN junction of layers 46, 47 and 48 that will deplete layers 46 and 48. Since the depletion depth is proportional to the voltage of the reverse bias, cutoff is achieved more readily because of the strategic position of layer 47. Transistor 30 is capable of operating at several hundred volts to a thousand volts.

Gate 37 controls by field-effect the current passing laterally underneath it through n— well 31 to extended drain region 46. Current flow in the extended drain region 46 is controlled by n— well 31 and buried layer 47. A field-effect from them radiates above and below buried layer 47 and pinches off current in the extended drain region 46 and p-top layer 48. Transistor 30 therefore effectively comprises an IGFET with a three-sided JFET. N— well 31 has to be depleted before breakdown occurs between p—well 44 and n— well 31.

While only extended drains have been used herein as examples for embodiments of the present invention, it is also advantageous to extend sources instead of or in combination with such extended drains. Buried layers similar to layers 27 and 47 can be used in the respective extended sources to realize the advantages described herein.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An n-channel type high-voltage MOS transistor comprising:
   a p− substrate (11) covered by a silicon dioxide layer (12);
   a metal source contact (14) extending through said silicon dioxide layer (12) to the substrate (11);
   a metal drain contact (16) extending through said silicon dioxide layer (12) to the substrate (11);
   a polysilicon gate (17) positioned between the source contact (14) and the drain contact (16) at a location where said silicon dioxide layer (12) is at its thinnest thickness and where the gate (17) is positioned slightly apart from said substrate (11) and insulated by said silicon dioxide layer (12), wherein an IGFET or MOSFET type of transistor is thus contained within an area proximate to the source contact (14) and the drain contact (16) and the gate (17);
   an insulation layer (18) covering the gate (17) and said silicon dioxide layer (12);
   a diffused p+ well (19) and a first diffused n+ well (21) adjacently beneath the source contact (14) in the substrate (11), wherein the first diffused n+ well (21) extends to contact an enhancement mode channel positioned beneath the gate (17) for control by the gate (17) and including a p-type threshold voltage implant (22) for providing for adjustment of the transistor threshold voltage and a p−type punch-through implant (23) for providing for avoidance of a punch-through voltage breakdown;
   a second diffused n+ well (24) in the substrate (11) adjacent to the metal drain contact (16);
   an n−type extended drain region (26) laterally encircling the second+ well (24) and reaching at its outer perimeter the surface of the substrate (11);
   an n−top layer (28) laterally encircling the second n+ (24) and positioned at the surface of the substrate (11); and
   a p−type JFET gate control layer (27) buried beneath the n-top layer (28), wherein the drain region (26) and n-top layer (28) form a channel for a JFET transistor of which the buried layer (27) is a gate and for providing for a splitting of a drain current around the gate control layer (27) and a recombining of said drain current in the second n+ well (24).

2. The transistor of claim 1, wherein:
   the extended drain region (26) is approximately symmetrical and extends from beneath the gate (17) to the second n+ well (24) and a similar distance to the opposite side.

3. A p−channel type high-voltage MOS transistor, comprising:
   an n− well (31) in a substrate (11') covered by a silicon dioxide layer (32);
   a metal source contact (34) extending through said silicon dioxide layer (32) to the substrate (11');
   a polysilicon gate (37) positioned between the source contact (34) and the drain contact (36) at a location where said silicon dioxide layer (32) is at its thinnest thickness and where the gate (37) is positioned slightly apart from the substrate (11') and insulated by said silicon dioxide layer (32), wherein an IGFET or MOSFET type of transistor is thus contained within an area proximate to the source contact (34) and the drain contact (36) and the gate (37);
   an insulation layer (38) covering the gate (37) and said silicon dioxide layer (32);
   a diffused n+ well (39) and a first diffused p+ well (41) adjacently beneath the source contact (34) in the substrate (11'), wherein said first diffused p+ well (41) extends to contact an enhancement mode channel positioned beneath the gate (37) for control by the gate (37);
   a second diffused p+ well (44) in the substrate (11') adjacent to the drain contact (36);
   a p−type extended drain region (46) laterally encircling the second p+ well (44) and reaching at its outer perimeter said n−well (31) in the surface of the substrate (11');
   a p−top layer (48) laterally encircling the second p+ well (44) and positioned at the surface of the substrate (11'); and
   an n−type JFET gate control layer (47) buried beneath the p−top layer (48), wherein the drain region (46) and the p−top layer (48) form a channel for a JFET transistor of which the buried layer (47) is a gate and for providing for a splitting of a drain current around the gate control layer (47) and a recombining of said drain current in the second p+ well (144).

4. The transistor of claim 3, wherein:
   the extended drain region (46) is approximately symmetrical and extends from beneath the gate (37) to the second p+ well (44) and a similar distance to the opposite side.

* * * * *